United States Patent [19]

Redfern

[11] 4,190,854
[45] Feb. 26, 1980

[54] TRIM STRUCTURE FOR INTEGRATED CAPACITORS

[75] Inventor: Thomas P. Redfern, San Jose, Calif.

[73] Assignee: National Semiconductor Corporation, Santa Clara, Calif.

[21] Appl. No.: 877,915

[22] Filed: Feb. 15, 1978

[51] Int. Cl.² .......................................... H01L 27/00
[52] U.S. Cl. .............................. 357/51; 219/121 LM; 361/271; 357/67
[58] Field of Search .................... 357/14, 23, 41, 51, 357/67; 29/574, 576 OC; 219/121 L, 121 LM; 361/271, 277, 278, 292, 402

[56] References Cited

U.S. PATENT DOCUMENTS

| | | | |
|---|---|---|---|
| 3,330,696 | 7/1967 | Ullery et al. | 29/576 |
| 3,860,836 | 1/1975 | Pedersen | 357/51 |
| 3,890,631 | 6/1975 | Tiemann | 357/23 |
| 4,001,869 | 1/1977 | Brown | 357/14 |
| 4,016,483 | 4/1977 | Rudin | 357/51 |
| 4,017,885 | 4/1977 | Kendall et al. | 357/14 |

Primary Examiner—William D. Larkins
Attorney, Agent, or Firm—Gail W. Woodward

[57] ABSTRACT

A capacitor suitable for integration into a monolithic integrated circuit is fabricated in two parallel connected sections. One section, using a thin oxide, constitutes most of the capacitance. A second section fabricated on a thick oxide constitutes a smaller capacitance per unit area but can be laser trimmed to provide a precise capacitance without damage to the integrated circuit. The trimmable section is desirably made using a conductive electrode material that is readily removed with laser energy.

4 Claims, 4 Drawing Figures

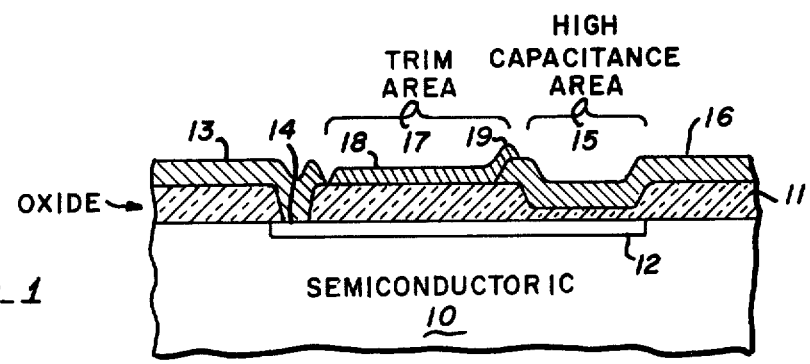
Fig_1
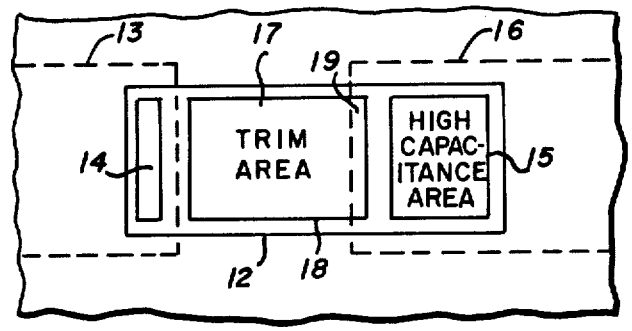
Fig_2
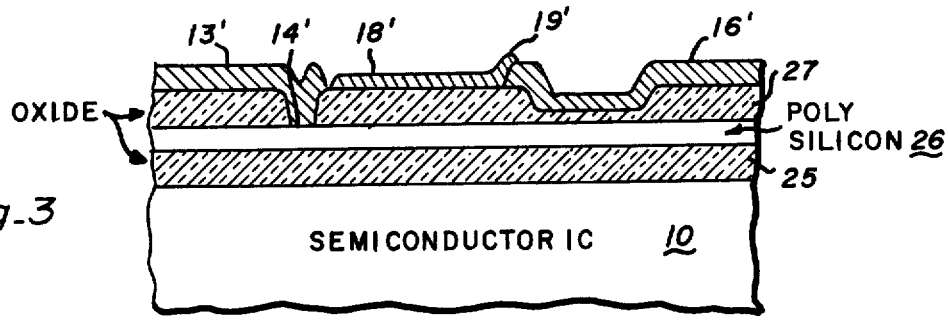
Fig_3
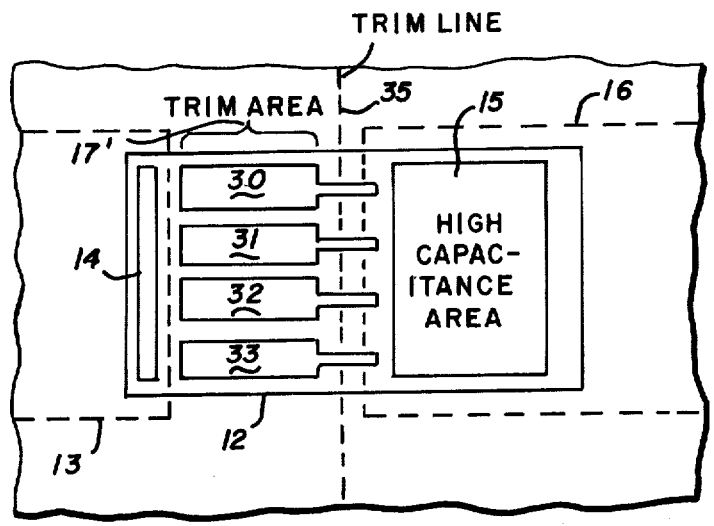
Fig_4

TRIM STRUCTURE FOR INTEGRATED CAPACITORS

BACKGROUND OF THE INVENTION

The invention relates to the fabrication of monolithic semiconductor integrated circuit (IC) structures and in particular is related to the incorporation of trimmable film capacitors therein. It has proven difficult to manufacture IC structures to the precision desired for many applications. Thin film integrated resistors have proven to be laser trimmable and laser trimming has been applied to certain semiconductor structures. More commonly, laser trimming has been achieved in the form of link severing. Here a multi-element structure is provided with shorting links during the IC manufacturing. Upon completion of the circuit, selected links are severed by means of a laser beam thereby to alter the circuit to achieve a desired electrical performance. Typically the links to be severed are either located over IC areas protected by special means or located on a portion of the IC which is not subject to laser damage. Such expedients add substantial complexity and/or area to the IC. In particular, in the fabrication of capacitors, the prior art devices typically incorporate a large number of separate parallel link-connected sections. After manufacture selected links are cut to reduce the total capacitance to as near to a desired value as possible. To achieve a precise final value either a large number of similar sized elements or a complex array of selected size elements must be used.

SUMMARY OF THE INVENTION

It is an object of the invention to provide a film capacitor in an integrated circuit wherein the capacitance can be laser trimmed without damage to the integrated structure.

It is a further object of the invention to form a film capacitor, suitable for integration into a semiconductor integrated circuit structure in two sections, one of which has high capacitance per unit area and the other of which has low capacitance per unit area, with the latter section being laser trimmable.

These and other objects are achieved as follows. A film capacitor is incorporated into an IC in two sections. The first section is constructed using the thin oxide techniques associated with insulated gate field effect transistor (IGFET) structures. The thin oxide provides a capacitor section having a large capacitance per unit area. A second section is constructed using the IGFET thick, or field region, oxide. Both sections are constructed on a common counter electrode that is an integral part of the IC. The thin oxide section is provided with a conventional conductive electrode of the kind used in the metal interconnect of the IC. The thick oxide section is provided with a conductive electrode preferably composed of a material that is readily trimmed with a laser beam. I have discovered that when the thick oxide is used with an easily trimmed alloy, such as a silicon-chromium alloy, laser trimming can be accomplished at a power level that will preclude damage to the underlying IC.

BRIEF DESCRIPTION OF THE DRAWING

FIG. 1 is a cross section of a portion of an IC structure showing a trimmable capacitor located thereon;

FIG. 2 is a fragment of the IC topography showing a trimmable capacitor located thereon;

FIG. 3 is a cross section of a portion of an IC structure of an alternative form to that of FIG. 1; and FIG. 4 is an alternative form of capacitor to that shown in FIG. 2.

DESCRIPTION OF THE INVENTION

FIG. 1 shows a cross section of an IC and illustrates the surface layers. The IC details have been omitted. It is to be understood that the various figures of drawing are not to scale and are only intended to illustrate the elements of the invention.

The substrate 10 is usually silicon and contains the elements of an array of IC devices (not shown). The surface is covered with an insulator 11, usually $SiO_2$, which protects the device and passivates the IC structure. In IC processing the $SiO_2$ (silica) layer is regarded as thick when it is on the order of a micron. Such oxides are typically called field oxides in MOSFET technology. When the oxides are to be used in the gate regions of transistors they are typically about 0.1 micron thick and are regarded as thin. Such oxides can be thermally grown as a genetic film or they can be deposited from a vapor phase. While the oxides are typically silica, they can contain other oxides in small quantity and still be effective to passivate and insulate.

The typical IC has a metallization pattern located on top of the oxide, usually aluminum, that acts to interconnect various elements in the IC via holes in the oxide film. This metallization can contain minor percentages of other elements such as copper or silicon.

While not shown, the metallization pattern can further be overcoated with a second deposited silica layer to further passivate and to protect the metallization. This layer typically contains a small percentage of $P_2O_5$.

In the structure of FIG. 1 a capacitor is to be fabricated into a portion of the surface films. To this end a diffused region 12 is created to form the capacitor counter electrode. This region is merely diffused to create a high conductivity layer that is contacted by metallization 13 which constitutes one terminal of the capacitor.

FIG. 2 shows a fragment of the IC topography associated with the FIG. 1 cross section. Here the metallization has been removed for clarity. Thus the metallization 13 is shown in dashed outline overlapping counter electrode 12. Region 14 represents the hole in oxide layer 11 where metallization 13 contacts counter electrode 12.

The oxide layer 11 is made thick (about one micron) as usual. However, over one portion of the capacitor the oxide is made thin (about 0.1 micron). This is represented as high capacitance area 15. Typically a 0.1 micron oxide will produce a capacitance of about 0.2 pf per square mil. Metallization 16, also shown in dashed outline in FIG. 2, overlaps high capacitance region 15 and forms the second capacitor plate. Thus a capacitor exists between terminals 13 and 16 and has a value determined largely by the area of region 15.

Under certain conditions where very large capacitance values are required, the oxide over region 15 can be composed of a high dielectric constant material. For example, a layer of rutile or mixed oxide, such as barium oxide-titanium oxide, can be employed.

Adjacent to high capacitance area 15 is a second area, called the trim area 17, which desirably lies entirely on top of thick oxide as shown. Metallization 18 forms a second capacitor area connected in parallel with the first by virtue of the metallization overlap at 19.

Desirably metallization 18 is different from that at 13 and 16 and is selected for its ease of removal by the application of radiant energy. It is well known that aluminum can be vaporized or trimmed from an IC using a laser beam. However, using the conventional 1.06 micron laser energy, aluminum acts as an excellent optical reflector. Accordingly, an inordinate power level must be used to remove the aluminum. The high power required makes the laser beam dangerous to the underlying IC structure. This means that when using laser trim the metal to be removed must be located over a portion of the IC not subject to damage. This places an undesirable constraint on circuit layout.

I have discovered that certain metal films can be removed by vaporization by a laser beam at beam energy values well below the threshold of damage of the IC structures. While other metals can be used, I prefer that metallization 18 be an alloy of about 70 percent silicon and 30 percent chromium. This so-called sichrome metal is preferred because it is easily deposited, adheres well to silicon oxide, is a good electrical conductor and is compatible with the IC structure both thermally and mechanically. Other useful materials include molybdenum, tungsten, tantalum, nickel-chromium alloy, niobium, and tantalum nitride. The metal is located on thick oxide and its removal can be accomplished without damage to the oxide or the underlying IC. Thus area 17 constitutes a laser trimmable capacitor area, or section, thus permitting a direct capacitance trim.

Typically area 15 is designed to be slightly smaller than is desired for the capacitor. Area 17 is designed to be slightly larger than the area needed to raise the total capacitance value to the desired value. Then a laser beam is used to trim away a portion of the metallization in area 17 to achieve the precise capacitance value.

By way of example, it has been found that typical production processes yield a ±10% variation in thin oxide thickness. Thus, while photolithographic processing can provide a fairly good control of area 15, the resulting capacitor can be expected to have a tolerance of about ±10%. Thus, if the thin oxide capacitance is to be 100 pf, the actual value could be 90–110 pf. In accordance with the invention, area 15 would be designed to produce a 90 pf capacitor which could be expected to range from 81 to 99 pf. Area 17 would then be designed to yield a capacitance of slightly over 20 pf. Since area 17 is on thick oxide, it would have to have an area of about 222% of that of area 15 (or slightly over twice). Then area 17 is laser trimmed to produce a measured 100 pf of capacitance.

In many IC applications it is not necessary to achieve an exact value, but rather, two or more capacitors are to be matched to each other. In this case, one capacitor is made normally on thin oxide. The matching capacitor is made in accordance with the invention in two sections. The thin oxide section is deliberately made smaller than the capacitor to be matched. The second section is then made to have an area that will give the trimmable capacitor a value in excess of the capacitor to be matched. The second section is then trimmed to produce the exact match desired. If more capacitors are to be matched, each additional one will be of the trimmable construction and trimmed to match.

Where capacitors are to be matched, the area required for the trimmable section does not need to be as large as in the above precise value example. If the area of the thin oxide portion of the trimmable capacitor is made 95% as large as the capacitor to be matched, the trim portion need only have an area of about 60% of the thin oxide area.

FIG. 3 shows an alternative form of trimmable capacitor construction. In this embodiment the capacitor counter electrode is electrically insulated from IC substrate 10. The IC substrate 10 is overcoated with an oxide film 25. Then a layer of polysilicon 26 is deposited. This layer is doped so as to make it a good electrical conductor. It should be noted that the IC substrate with oxide and polysilicon layers as shown is often used in conventional IC fabrication. Thus this capacitor embodiment is readily incorporated into conventional IC processing. A second oxide layer 27 is located over the polysilicon 26 to serve as the capacitor dielectric. Oxide 27 has a thin oxide region to serve as a high capacitance area and a hole 14' through which the polysilicon counter electrode can be contacted by metallization 13'. The capacitor is formed in two sections as described in connection with FIGS. 1 and 2. Metallization 16' provides the high capacitance section electrode and metallization 18' provides the trimmable section.

Functionally the embodiment of FIG. 3 is the same as that of FIG. 1 and could employ the same topography as shown in FIG. 2. The main difference is that the counter electrode 26 of FIG. 3 is separately available from substrate 10 whereas counter electrode 12 of FIG. 1 is not.

FIG. 4 shows an alternative embodiment of capacitor topography shown in FIG. 2. This structure can be employed in either of the embodiments in FIGS. 1 and 3. Counter electrode 12 is as shown in FIG. 2 as are metallizations 13 and 16. High capacitance area 15 is also as shown in FIG. 2. However, trim area 17' is made differently. Instead of a single trim capacitor, four are shown as metallizations 30–33. While four are shown, any desired number could be employed. Each of the metallizations 30–33 has a major area that lies over the thick oxide of trim area 17'. Each one also has a link that extends to overlap metallization 16.

A gross trim adjustment is afforded along trim line 35. If a laser beam is translated along line 35, all four links will be severed and the trim area 17' will contribute very little capacitance. Thus trim line 35 affords a step adjustment of trim capacitance in 25% steps (for the array of 4 as shown). If ten such segments were employed, the steps would be 10%. Once the gross adjustment is made, a fine adjustment can then be made by laser trimming the enlarged portions of the still connected metallization sections. Thus the structure of FIG. 4 affords a gross step adjustment that alone will be adequate for many applications as well as a fine adjustment that can provide the exactness of trim needed for virtually any desired precision.

In addition, while not shown, each of the metallizations 30–33 could incorporate an underlying thin oxide region, thereby to reduce the area requirements. In this form each metallization would employ the dual section concept and each would be separately trimmable as well as selectively removable by virtue of severing the connecting link.

The invention has been described and several embodiments shown. When a person skilled in the art reads the above disclosure, other equivalents and alternatives will be evident. Accordingly, it is intended that the scope of the invention be limited only by the following claims.

I claim:

1. An integrated circuit comprising:
   a semiconductor substrate;
   a conductive counter electrode physically associated with said substrate, said counter electrode being formed from a conductive layer deposited on a first insulating layer located on said semiconductor substrate;
   a second insulating layer located over said counter electrode, said second insulating layer having a relatively thick region and a relatively thin region;
   a first conductive electrode covering said thin region of said second insulating layer;
   a second conductive electrode covering a portion of said thick region of said second insulating layer, said second conductive electrode being composed of a material selected from the group consisting of silicon-chromium alloy, molybdenum tungsten, tantalum, nickel-chromium alloy, niobium, and tantalum nitride;
   means for connecting said first and second conductive electrodes; and
   means for making electrical connection to said counter electrode and said first conductive electrode to create a capacitor the value of which can be laser trimmed without damaging said integrated circuit.

2. The integrated circuit of claim 1 wherein said semiconductor substrate is silicon, said counter electrode is polysilicon, said insulating layer is silicon dioxide, said first conductive electrode is aluminum, and said second conductive electrode is an alloy of silicon and chromium.

3. A trimmable film type capacitor, said capacitor having a common counter electrode which is an integral element in a semiconductor integrated circuit, said capacitor comprising:
   a first section having a relatively thin dielectric layer located over said counter electrode and a first conductive electrode located on said thin dielectric layer;
   a second section having a relatively thick dielectric layer located over said counter electrode and a second conductive electrode located on said thick dielectric layer, said second conductive electrode being composed of an alloy of chromium and silicon; and
   means for connecting said second section to said first section whereby a laser beam can be employed to remove a portion of said second conductive electrode to adjust the value of said capacitor.

4. An integrated circuit comprising:
   a semiconductor substrate;
   a conductive counter electrode physically associated with said substrate;
   an insulating layer located over said counter electrode, said insulating layer having a relatively thick region and a relatively thin region;
   a first conductive electrode covering said thin region of said insulating layer;
   a second conductive electrode covering a portion of said thick region of said insulating layer, said second conductive electrode being composed of an alloy of silicon and chromium;
   means for connecting said first and second conductive electrodes; and
   means for making electrical connection to said counter electrode and said first conductive electrode to create a capacitor, the value of which can be laser trimmed without damaging said integrated circuit.

* * * * *